(12) United States Patent
Conover et al.

(10) Patent No.: US 11,246,251 B2
(45) Date of Patent: Feb. 8, 2022

(54) MICRO-COMPONENT TRANSFER SYSTEMS, METHODS, AND DEVICES

(71) Applicant: Seagate Technology LLC, Cupertino, CA (US)

(72) Inventors: Michael J Conover, Minneapolis, MN (US); Javier I Guzman, Minneapolis, MN (US); I-Fei Tsu, Chanhassen, MN (US); Joseph J Schobel, Lakeville, MN (US)

(73) Assignee: Seagate Technology LLC, Fremont, CA (US)

( * ) Notice: Subject to any disclaimer, the term of this patent is extended or adjusted under 35 U.S.C. 154(b) by 133 days.

(21) Appl. No.: 16/402,054

(22) Filed: May 2, 2019

(65) Prior Publication Data

US 2020/0352070 A1  Nov. 5, 2020

(51) Int. Cl.
*H05K 13/08* (2006.01)
*H05K 13/04* (2006.01)
*B25J 7/00* (2006.01)
*B25J 19/02* (2006.01)

(52) U.S. Cl.
CPC ............ *H05K 13/0815* (2018.08); *B25J 7/00* (2013.01); *B25J 19/022* (2013.01); *H05K 13/0406* (2018.08); *H05K 13/0408* (2013.01); *H05K 13/0812* (2018.08)

(58) Field of Classification Search
CPC .... H05K 13/00; H05K 13/04; H05K 13/0404; H05K 13/0406; H05K 13/0408; H05K 13/08; H05K 13/081; H05K 13/0812; H05K 13/0813; H05K 13/0815; B25J 7/00; B25J 19/00; B25J 19/02; B25J 19/021; B25J 19/022

USPC .... 324/76.11, 105, 106, 600, 649, 658, 661, 324/662, 500, 537, 750.16, 750.23; 702/85, 97, 127, 155, 158

See application file for complete search history.

(56) References Cited

U.S. PATENT DOCUMENTS

| 3,918,704 | A | * | 11/1975 | Sugiyama | .............. B65H 43/00 271/201 |
| --- | --- | --- | --- | --- | --- |
| 5,372,853 | A | | 12/1994 | Roberto | |
| 5,430,904 | A | * | 7/1995 | Ono | ..................... B65H 37/007 118/257 |
| 9,162,880 | B2 | | 10/2015 | Higginson et al. | |
| 9,272,386 | B2 | * | 3/2016 | Suen | ....................... B24B 37/30 |
| 9,308,649 | B2 | | 4/2016 | Golda et al. | |
| 9,318,475 | B2 | | 4/2016 | Bibi et al. | |
| 9,624,100 | B2 | | 4/2017 | Bathurst et al. | |
| 9,768,345 | B2 | | 9/2017 | Hu et al. | |
| 9,842,782 | B2 | | 12/2017 | Chen et al. | |
| 10,073,043 | B2 | | 9/2018 | Jeanne et al. | |

(Continued)

FOREIGN PATENT DOCUMENTS

JP    2002141487 A    5/2002

*Primary Examiner* — Hoai-An D. Nguyen
(74) *Attorney, Agent, or Firm* — Faegre Drinker Biddle & Reath (57) ABSTRACT

A system includes a computing device with circuitry and memory with instructions for execution by the circuitry. The instructions include monitoring signals indicative of a non-uniform distance between a transfer head and a receiving substrate, and, in response to the monitored signals, actuating one or more actuators towards the transfer head or the receiving substrate to deform the transfer head or the receiving substrate.

20 Claims, 10 Drawing Sheets

(56) References Cited

U.S. PATENT DOCUMENTS

| | | |
|---|---|---|
| 10,183,401 B2 | 1/2019 | Higginson et al. |
| 2002/0096994 A1 | 7/2002 | Iwafuchi et al. |
| 2003/0079841 A1* | 5/2003 | Kozaki ................ B65H 37/007 |
| | | 156/577 |
| 2011/0038150 A1 | 2/2011 | Woodgate et al. |
| 2015/0371585 A1 | 12/2015 | Bower et al. |
| 2015/0371874 A1 | 12/2015 | Bower et al. |
| 2016/0016399 A1 | 1/2016 | Bower et al. |
| 2016/0372628 A1 | 12/2016 | Henley et al. |
| 2017/0162552 A1 | 6/2017 | Thompson |
| 2017/0287789 A1 | 10/2017 | Bower et al. |
| 2017/0288102 A1 | 10/2017 | Farrens et al. |
| 2017/0373046 A1 | 12/2017 | Gardner et al. |
| 2018/0138071 A1 | 5/2018 | Bower et al. |
| 2018/0194014 A1 | 7/2018 | Bibl et al. |
| 2018/0374829 A1 | 12/2018 | Henley |

* cited by examiner

MICRO-COMPONENT TRANSFER SYSTEMS, METHODS, AND DEVICES

SUMMARY

In certain embodiments, a system includes a computing device with circuitry and memory with instructions for execution by the circuitry. The instructions include monitoring signals indicative of a non-uniform distance between a transfer head and a receiving substrate, and, in response to the monitored signals, actuating one or more actuators towards the transfer head or the receiving substrate to deform the transfer head or the receiving substrate.

In certain embodiments, a method for transferring electrical components from a transfer head to a receiving substrate is disclosed. The method includes monitoring signals indicative of a non-uniform distance between the transfer head and the receiving substrate and actuating one or more actuators towards the transfer head or the receiving substrate to deform the transfer head or the receiving substrate, based at least in part on the monitored signals.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Manufacturing high-resolution displays (e.g., displays for smartwatches, smartphones, tablets, laptops, televisions, augmented reality headsets) or sensor devices often requires transfer of many small electronic components (e.g., micro/nano-sized components such as microLEDs or sensors) from one substrate (e.g., a transfer head) onto another substrate (e.g., a receiving substrate). Manufacturing displays efficiently in high volume involves processes for high-speed batch-transfer of such electronic components. One concern with batch-transfer processes is variations in flatness and thickness of the transfer head and the receiving substrate. As will be explained in more detail below, such variations can result in a non-uniform distance between the transfer head and the receiving substrate during the transfer of electronic components—thus resulting in some electrical components not transferring properly to the receiving substrate.

Certain embodiments of the present disclosure involve systems, methods, and devices for compensating for variations between transfer heads and receiving substrates.

Figure 1:
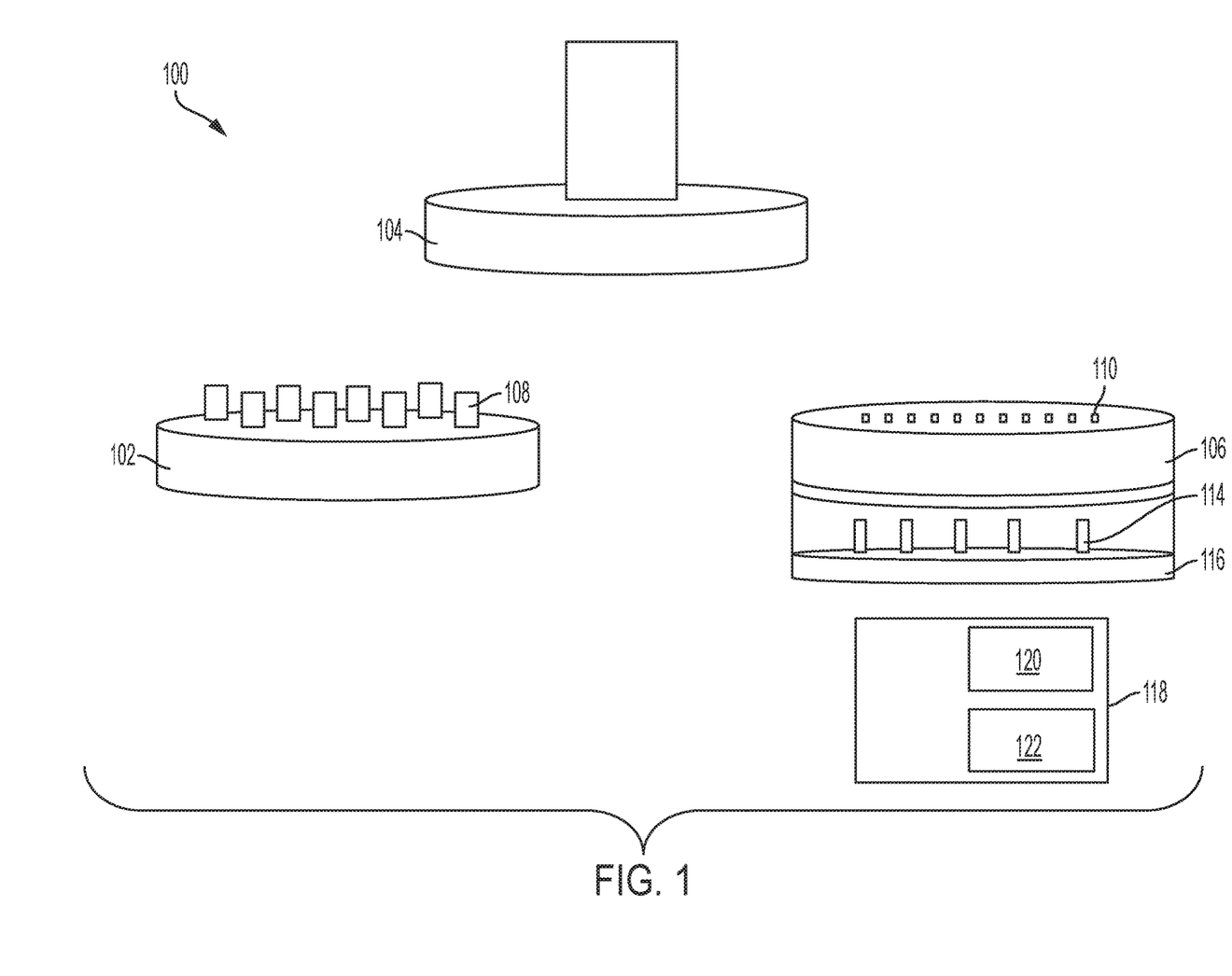
FIG. 1 shows a schematic of a transfer system for electrical components, in accordance with certain embodiments of the present disclosure.

FIG. 1 shows a system 100 for transferring electrical components in batches. The system 100 includes a source substrate 102, a transfer head 104 (e.g., a transfer coupon, a stamp, a donor substrate, an interposer), and a receiving substrate 106 (e.g., a backplane circuit for a display, an intermediate substrate for additional transfers). During assembly, the transfer head 104 transfers electrical components 108 such as microLEDs or sensors from the source substrate 102 to the receiving substrate 106 by picking up the electrical components 108 from the source substrate 102 and placing the electrical components 108 on the receiving substrate 106. The transfer head 104 can carry thousands of electrical components 108 at a time. The electrical components 108 can be picked and placed in groups (e.g., by color of microLED) or as an entire array of hundreds of thousands of microLEDs.

Figure 2A:
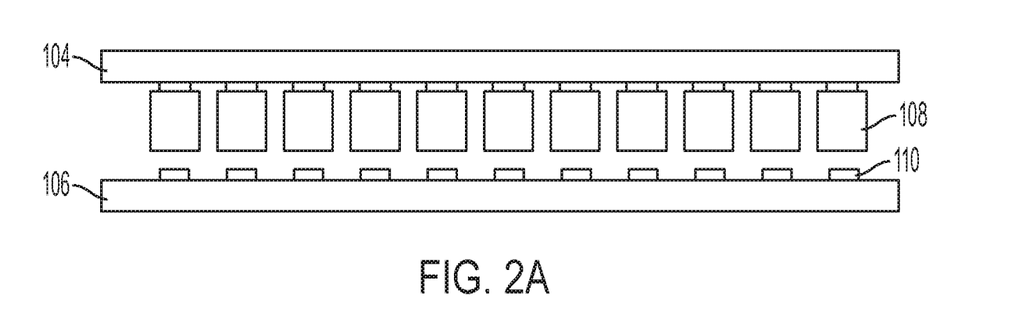
FIGS. 2A-C show a schematic side view of components of the system of FIG. 1 at various stages during a transfer of the electrical components, in accordance with certain embodiments of the present disclosure.
Figure 2B:
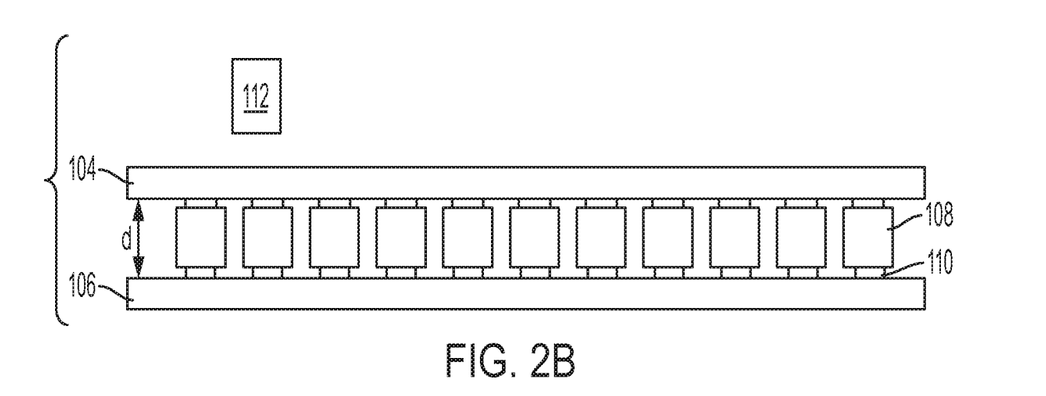
Figure 2C:
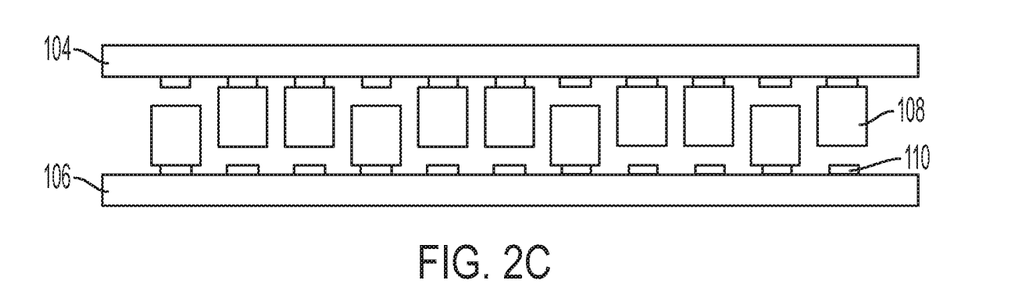

FIGS. 2A-C show stages of the process of transferring the electrical components 108 from the transfer head 104 to the receiving substrate 106. FIG. 2A shows the transfer head 104 positioned above the receiving substrate 106 such that the electrical components 108 are aligned with respective bond pads 110 on the receiving substrate 106. The transfer head 104 and/or the receiving substrate 106 are moved closer to each other such that the electrical components 108 contact the bond pads 110, as shown in FIG. 2B. Optimally, the distance (i.e., "d" in FIG. 2B) between the transfer head 104 and the receiving substrate 106 is substantially uniform when the electrical components 108 are ready to be transferred to the receiving substrate 106. If the distance is not uniform, some of the electrical components 108 may fail to transfer properly. For example, some of the electrical components 108 may not mechanically couple or electrically couple to the bond pads 110 on the receiving substrate 106.

In certain embodiments, the electrical components 108 are mechanically coupled and electrically coupled to the bond pads 110 by reflowing solder or a solder-like materials via selective heating of the receiving substrate 106. In certain embodiments, the electrical components 108 are first mechanically coupled to the bond pads 110 via an adhesive, electrostatic forces, and the like. Once the electrical components 108 are coupled (e.g., mechanically coupled and/or electrically coupled) to the bond pads 110, the electrical components 108 can be released from the transfer head 104 using a variety of methods, including by utilizing lasers, adhesive forces, electrostatic forces, MEMS-based devices, magnetics, and the like. For example, the system 100 can include one or more lasers 112 that emit light that is directed towards the transfer head 104. The transfer head 104 can include a release layer that is ablated or otherwise damaged by the emitted light such that the underlying electrical components 108 are released from the transfer head 104. In such arrangements, the transfer head 104 may include a substrate that is optically transparent to the wavelength of the emitted light. The emitted light can be selectively activated and directed such that all or only a portion of the electrical components 108 are released from the transfer head 104. As shown in FIG. 2C, after the desired electrical components 108 are coupled to the receiving substrate 106 and released from the transfer head 104, the transfer head 104 and the receiving substrate 106 can be moved away from each other. The transfer head 104 can then pick up additional electrical components 108 from the source substrate 102 or another source substrate and repeat the process of transferring the electrical components 108. As mentioned previously, the electrical components 108 can be picked and placed in groups such that only a desired subset (e.g., one color of microLED) of the electrical components 108 are transferred to the receiving substrate 106 at a given time.

Figure 3A:
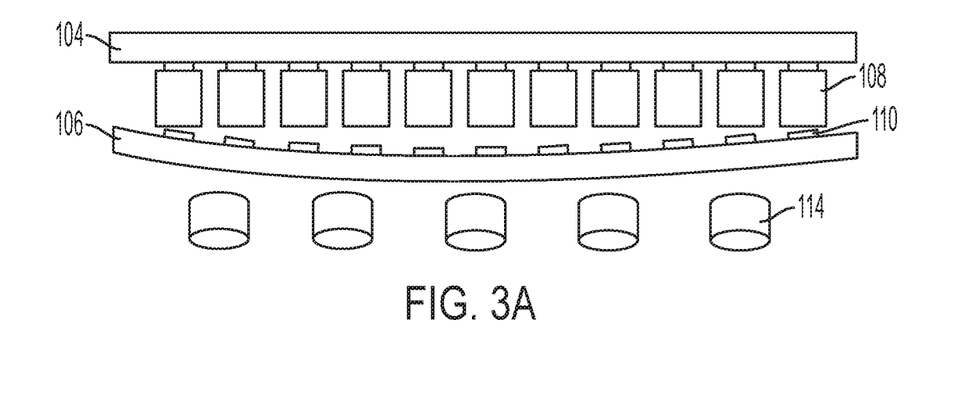
FIGS. 3A and 3B show a schematic side view of the system at various stages during a transfer of electrical components, in accordance with certain embodiments of the present disclosure.

As mentioned above, the distance "d" between the transfer head 104 and the receiving substrate 106 may vary from point to point. These variations may be due to variations in flatness and thickness of the transfer head 104 and the receiving substrate 106. Further, because the transfer head 104 and the receiving substrate 106 may be flexible or deformable, the transfer head 104 and the receiving substrate 106 may have flexed or warped at certain points. FIG. 3A shows an example of the transfer head 104 and the receiving substrate 106 having a non-uniform distance between the two. At the stage shown in FIG. 3A and given the non-uniform distance, the electrical components 108 positioned at or near the middle in the figure would likely fail to transfer properly from the transfer head 104 to the receiving substrate 106.

In certain embodiments, the system 100 can include one or more actuators 114 that can be used to shape the transfer head 104 and/or the receiving substrate 106. For example, the actuators 114 can be controlled (e.g., individually controlled) to extend toward and contact the transfer head 104 and/or the receiving substrate 106 to cause the transfer head 104 and/or the receiving substrate 106 to flex or deform at or near the point of contact. The shape of the transfer head 104 and/or the receiving substrate 106 can be controlled such that the distance between the two can be controlled as desired (e.g., to have a uniform distance). Put another way, the actuators 114 can be used to deform the transfer head 104 and/or the receiving substrate 106 such that their surface profiles match each other. As will be described in more detail below, the actuators 114 can be actuated in response to various measurements such as measurements indicating a distance or level of contact between the transfer head 104 and the receiving substrate 106 at various points.

Figure 3B:
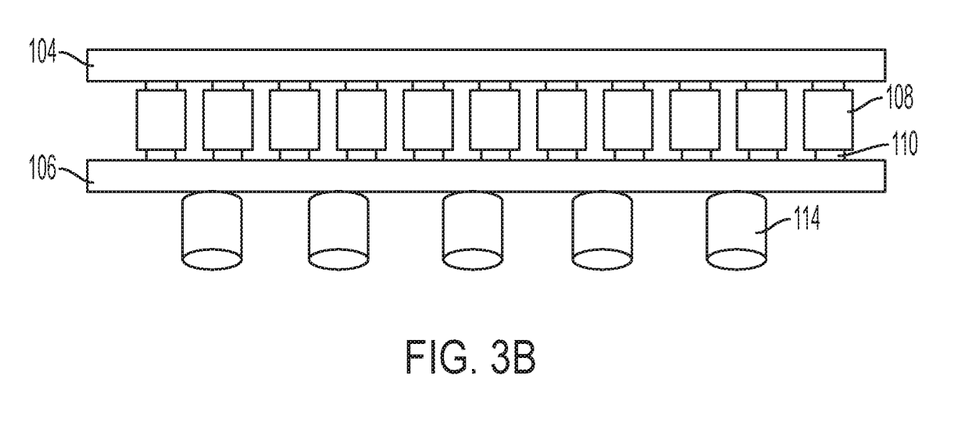

Although FIG. 3B shows the transfer head 104 and/or the receiving substrate 106 being shaped such that they are both flat and parallel to each other, the actuators 114 can be used to shape the profiles such that they are not flat but otherwise match each other. For example, instead of the actuators 114 being used to shape the receiving substrate 106 in FIG. 3A to be flat, the actuators 114 could be applied to the transfer head 104 such that the transfer head 104 deforms to match the curved shape of the receiving substrate 106 shown in FIG. 3A.

As shown in FIG. 1, the actuators 114 can be secured to a base assembly 116 on which the receiving substrate 106 is positioned during transfer of the electrical components 108. Receiving substrates can be picked and placed onto the base assembly 116 for the transfer process and removed from the base assembly 116 after the electrical components 108 have been transferred. As such, the actuators 114 can be permanently attached to the base assembly 116 and used during multiple transfer processes, as opposed to being permanently attached (or otherwise bonded) to the transfer head 104 or the receiving substrate 106 itself.

In certain embodiments, the actuators 114 can be mechanical actuators (e.g., electro-mechanical actuators) such as piezo-based actuators, voice-coil-based actuators, or magnetorestriction-based actuators. For example, the actuators 114 can be electrically coupled to a power source, which selectively applies a current or voltage to the actuators 114 to extend toward or retract the actuators away from the transfer head 104 and/or the receiving substrate 106. Although only a few actuators 114 are shown in the figures, the system 100 could have hundreds of actuators 114 in various arrays and that are individually addressable that act like "fingers" that shape the transfer head 104 and/or the receiving substrate 106. For example, each actuator 114 can be associated with a portion of the transfer head 104 or the receiving substrate 106 such that a given actuator 114 controls local deformation of the transfer head 104 or the receiving substrate 106 while another actuator 114 controls local deformation at another area of the transfer head 104 or the receiving substrate 106.

In order to know which actuators 114 to activate and to what extent, the system 100 can use various methods to measure spacing between or degree of contact of the transfer head 104 and the receiving substrate 106. As will be described in more detail below, the disclosed methods can measure spacing between or degree of contact on the transfer head 104 and/or the receiving substrate 106 at multiple points such that the actuators 114 can be used to control the shape of the transfer head 104 and/or the receiving substrate 106 at several points along the transfer head 104 and/or the receiving substrate 106. For example, an actuator 114 can be associated with each measured point to correct the shape of the transfer head 104 and/or the receiving substrate 106 at or near the measured point. More specifically, if the system 100 included four measurement points, the system 100 could include four actuators 114, one associated with each measurement point. The methods described below take advantage of the fact that the transfer head 104 and/or the receiving substrate 106 already contain circuitry that can be measured and/or probed during the transfer process.

The system 100 can include one or more computing devices 118 (e.g., personal computers, laptops, servers, or controllers) that contain one or more processors 120 and memory 122 that receive measurements (e.g., measurements indicating spacing or degree of contact) and control activation of the actuators 114. For example, the methods disclosed herein and outlined in the figures can be implemented using computer-readable instructions/code that are stored in the memory 122 for execution by circuitry of the one or more processors 120 of the computing devices 118. The one or more computing devices 118 and its components can be communicatively and electrically coupled to other components (e.g., sensors, actuators) of the system 100.

Figure 4:
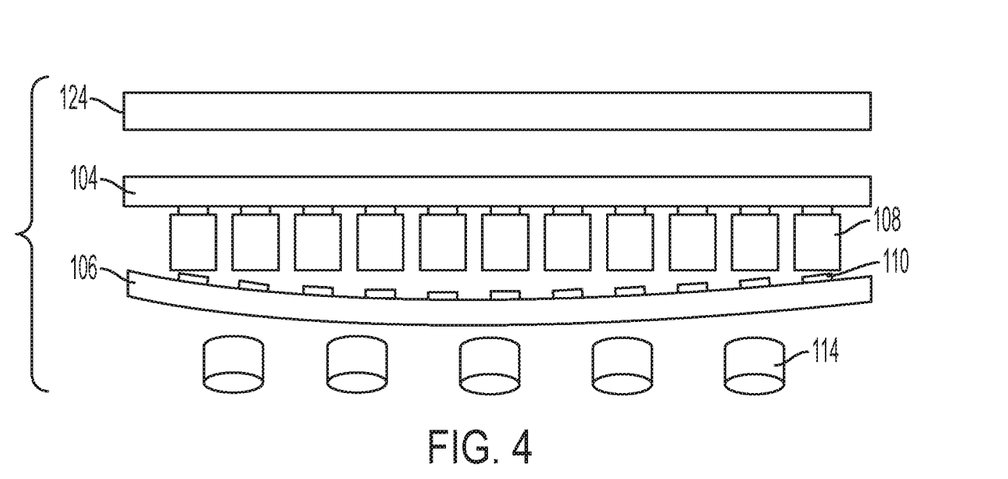
FIG. 4 shows a schematic side view of a system utilizing a photoelectric measurement approach, in accordance with certain embodiments of the present disclosure.
Figure 5:
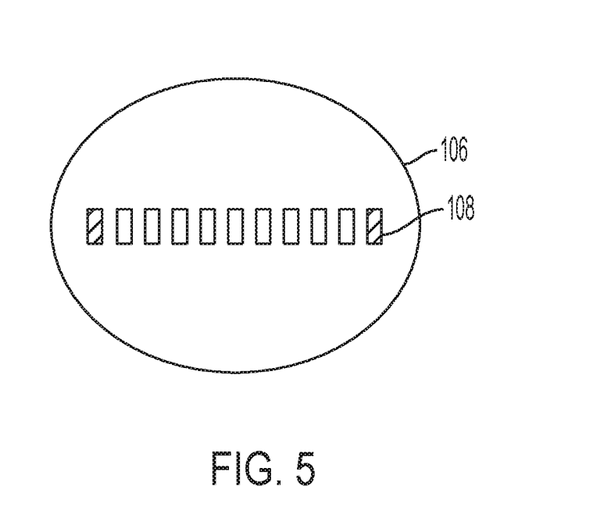
FIG. 5 shows a schematic top view of a system utilizing the photoelectric measurement approach of FIG. 4, in accordance with certain embodiments of the present disclosure.
Figure 6:
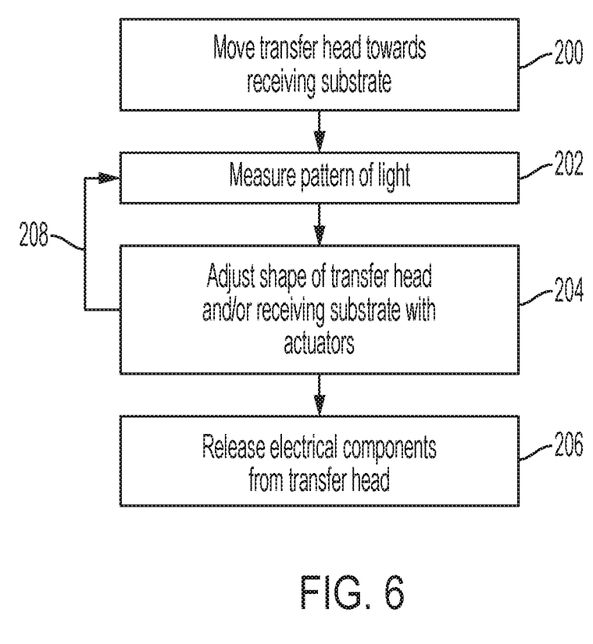
FIG. 6 shows a block diagram of various steps for carrying out the photoelectric measurement approach of FIGS. 4 and 5, in accordance with certain embodiments of the present disclosure.

FIGS. 4-6 show features and steps that utilize photoelectric measurements during a batch-transfer of the electrical components 108. For this method, the transfer head 104 can include a transparent electrical contact layer that allows current to flow from the receiving substrate 106 through the electrical components 108 as the receiving substrate is energized. The individual electrical components 108 electrically coupled to the receiving substrate 108 will become energized (e.g., emit light if the electrical components 108 are LEDs), and the individual electrical components 108 not electrically coupled will not be energized.

As the transfer head 104 is moved towards the receiving substrate 106 (block 200 in FIG. 6), the electrical components 108 will begin to electrically couple to the receiving substrate 106. For example, FIG. 5 shows a view through the transfer head 104 of two electrical components 108 being energized (represented by solid black rectangles) and the remaining electrical components not energized. The system 100 can include a detector 124 (e.g., an optical detector such as a camera or an array of photodetectors) positioned behind the transfer head 104. The detector 124 can measure the pattern of light output across all electronic devices 108 being transferred or perhaps across one or more rows of electrical components 108 (block 202 in FIG. 6). Based on the detected light emitted by the electrical components 108 (or lack of light in certain areas), the system 100 can actuate one or more of the actuators 114 to adjust the shape of the transfer head 104 and/or the receiving substrate 106 (block 204 in FIG. 6). For example, areas without a minimum percentage of energized electrical components 108 can be the areas targeted for shaping. The actuators 114 can be actuated such that the actuators 114 move toward and contact the transfer head 104 and/or the receiving substrate 106 such that the actuators 114 cause the transfer head 104 and/or the receiving substrate 106 to deform. During the transfer process, the detector 124 can continuously detect light emitted by the electrical components 108. For example, the transfer process can include a feedback loop 208 between the measurements of the pattern of light and the actuation of the actuators 114 that helps facilitate real-time adjustment of the actuators 114. Once an acceptable number of electrical components 108 are energized (e.g., once the transfer head 104 and/or the receiving substrate 106 have a more uniform distribution of contact), the actuators 114 can be locked into position and the electrical components 108 released from the transfer head 104 (block 206 in FIG. 6). The transfer head 104 can then be moved away from the base assembly 116 and be prepared to pick up another set of electrical components (e.g., LEDs that emit a different wavelength of light) for transferring to the same receiving substrate 106 or to a different receiving substrate that gets positioned on the base assembly 116.

Figure 7:
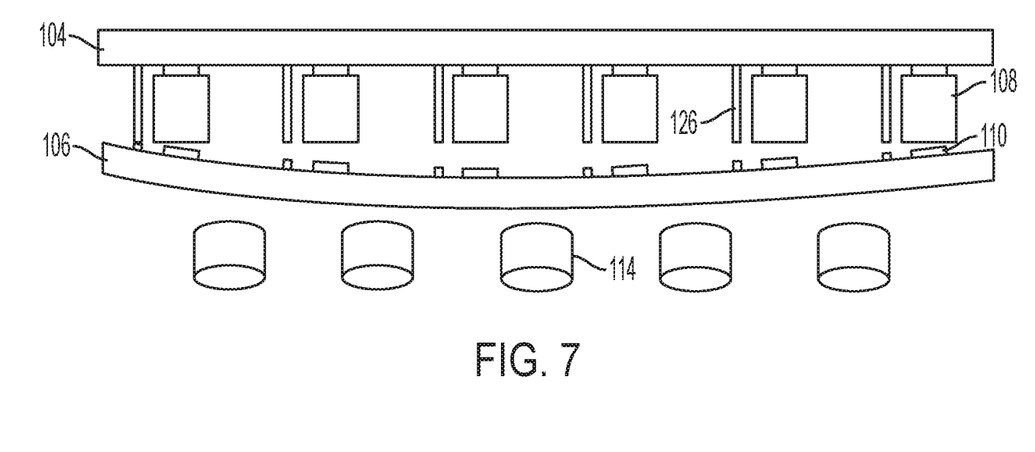
FIG. 7 shows a schematic side view of a system utilizing a conductive measurement approach, in accordance with certain embodiments of the present disclosure.
Figure 8:
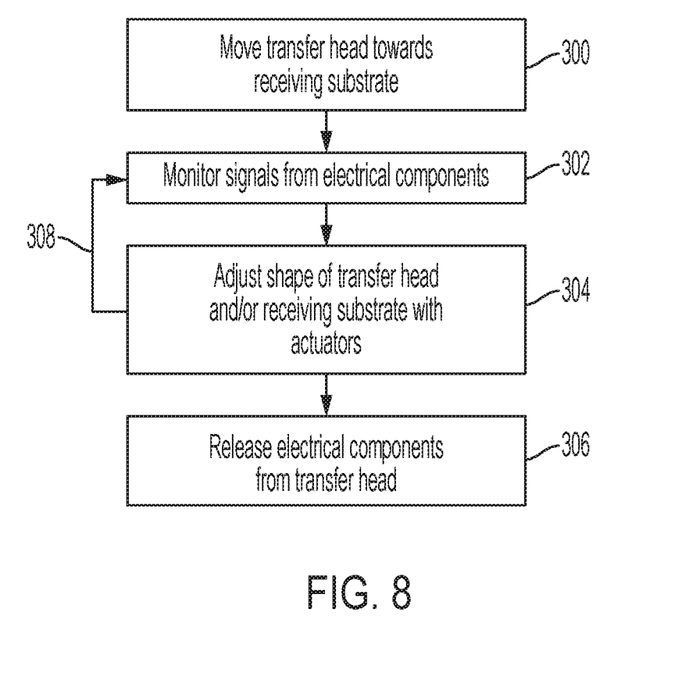
FIG. 8 shows a block diagram of various steps for carrying out the conductive measurement approach of FIG. 7, in accordance with certain embodiments of the present disclosure.

FIGS. 7 and 8 show features and steps that utilize conductivity measurements during a batch-transfer of the electrical components 108. For this method, circuitry of the transfer head 104 and/or the receiving substrate 106 can be used to monitor current, voltage, or resistance of the electrical components 108 as contact is made between the electrical components 108 and the receiving substrate 106.

As the transfer head 104 is moved towards the receiving substrate 106 (block 300 in FIG. 8), the electrical components 108 will begin to electrically couple to the receiving substrate 106. Signals from the electrical components 108 can be monitored for indications that the electrical components 108 are electrically coupled to the receiving substrate 106 (block 302 in FIG. 8). Based on the signals, the system 100 can actuate one or more of the actuators 114 to adjust the shape of the transfer head 104 and/or the receiving substrate 106 (block 304 in FIG. 8). For example, areas without a minimum percentage of energized electrical components 108 can be the areas targeted for shaping. The actuators 114 can be actuated such that the actuators 114 move towards and contact the transfer head 104 and/or the receiving substrate 106 such that the actuators 114 cause the transfer head 104 and/or the receiving substrate 106 to deform. During the transfer process, the system 100 can monitor the signals from the electrical components 108. For example, the transfer process can include a feedback loop 308 between the measurements of the signals from the electrical components 108 and the actuation of the actuators 114 that helps facilitate real-time adjustment of the actuators 114. Once an acceptable number of electrical components 108 are energized, the actuators 114 can be locked into position and the electrical components 108 released from the transfer head 104 (block 306 in FIG. 8).

Alternatively, the transfer head 104 and/or the receiving substrate 106 can include an array of conductive pillars 126 to be electrically coupled to a circuit trace on the transfer head 104 and/or the receiving substrate 106. The conductive pillars 126 would be a similar height as the electrical components 108 and could be grouped in arrays corresponding to the position of the actuators 114. As the transfer head 104 approaches the receiving substrate 106, the system 100 could monitor the current flowing between each zone of the conductive pillars 126 and the receiving substrate 106, and could locally adjust the shape of the transfer head 104 and/or the receiving substrate 106 to compensate for variations.

Figure 9:
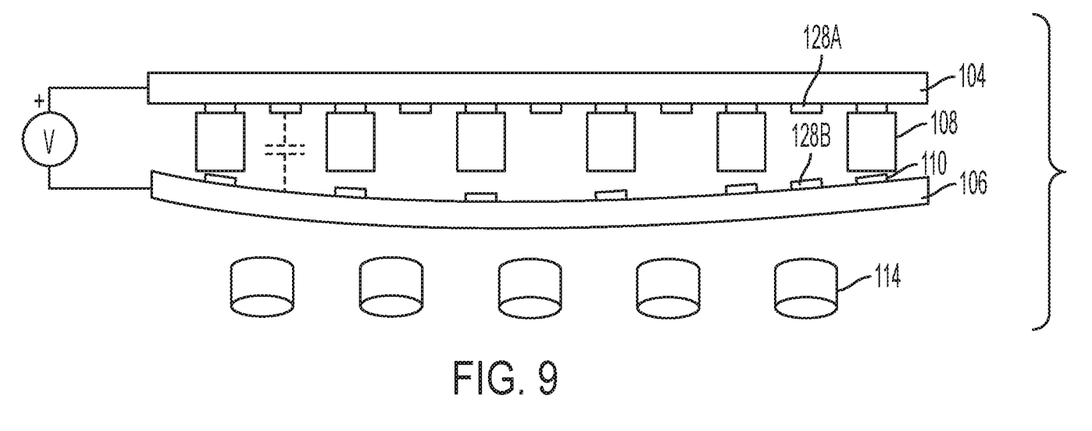
FIG. 9 shows a schematic side view of a system utilizing a perpendicular capacitance measurement approach, in accordance with certain embodiments of the present disclosure.
Figure 10:
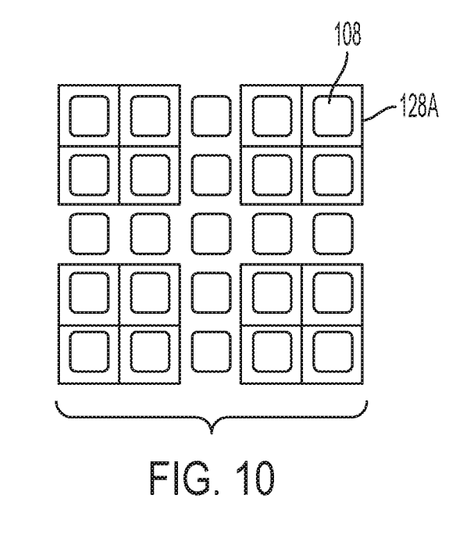
FIG. 10 shows a schematic top view of a system utilizing the perpendicular capacitance measurement approach of FIG. 9, in accordance with certain embodiments of the present disclosure.
Figure 11:
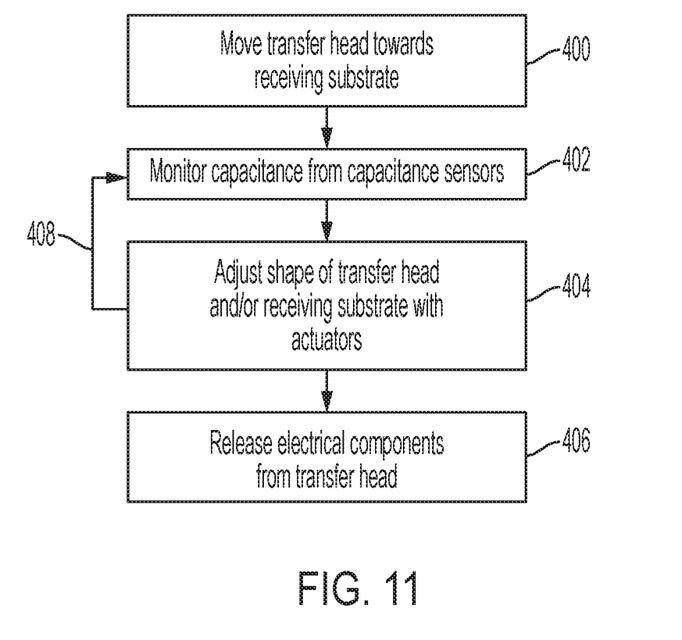
FIG. 11 shows a block diagram of various steps for carrying out the perpendicular capacitance measurement approach of FIGS. 9 and 10, in accordance with certain embodiments of the present disclosure.

FIGS. 9-11 show features and steps that utilize capacitance measurements during a batch-transfer of the electrical components 108. For this method, the transfer head 104 and/or the receiving substrate 106 would include a first set of conductive grids 128A that function as components of capacitance-based sensors. In certain embodiments, the conductive grids 128A would be divided into zones, with each capacitive grid 128A corresponding to a position of one of the actuators 114. The opposing transfer head 104 or the receiving substrate 106 would include a second set of conductive grids 128B corresponding to respective conductive grids of the first set of conductive grids 128A. Together, each corresponding pair of conductive grids from the two sets of conductive grids would form a capacitive sensor.

As the transfer head 104 is moved towards the receiving substrate 106 (block 400 in FIG. 11), each of the capacitance sensors will generate signals indicative of the measured capacitance. Signals from the capacitance sensors can be monitored to see how closely the measured capacitances match each other (block 402 in FIG. 11). Based on the signals, the system 100 can actuate one or more of the actuators 114 to adjust the shape of the transfer head 104 and/or the receiving substrate 106 (block 404 in FIG. 11) until the capacitance measured by the various capacitance sensors closely matches each other. The actuators 114 can be actuated such that the actuators 114 move toward and contact the transfer head 104 and/or the receiving substrate 106 such that the actuators 114 cause the transfer head 104 and/or the receiving substrate 106 to deform. During the transfer process, the system 100 can monitor the signals from the capacitance sensors. For example, the transfer process can include a feedback loop 408 between the measurements of the signals from the capacitance sensors and the actuation of the actuators 114 that helps facilitate real-time adjustment of the actuators 114. Once the measured capacitances are acceptable, the actuators 114 can be locked into position and the electrical components 108 released from the transfer head 104 (block 406 in FIG. 11).

Figure 12:
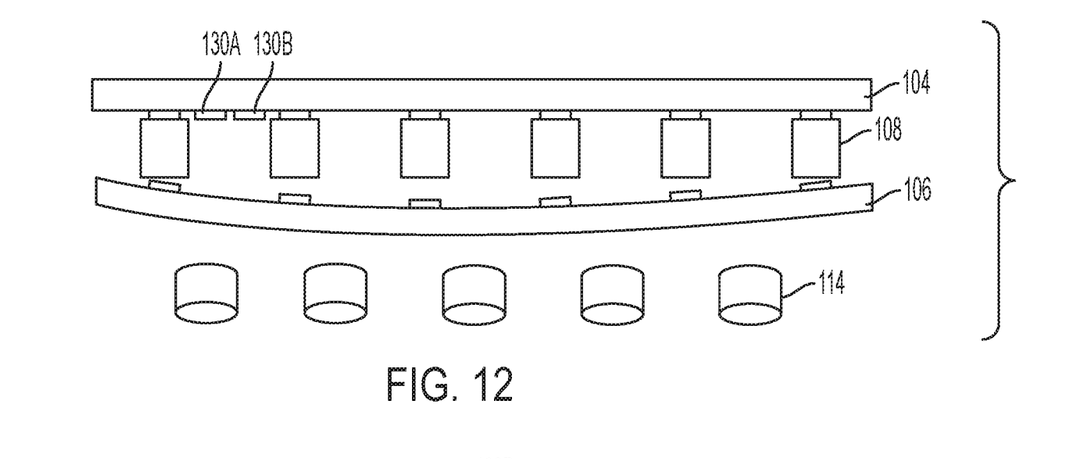
FIG. 12 shows a schematic side view of a system utilizing a lateral capacitance measurement approach, in accordance with certain embodiments of the present disclosure.
Figure 13:
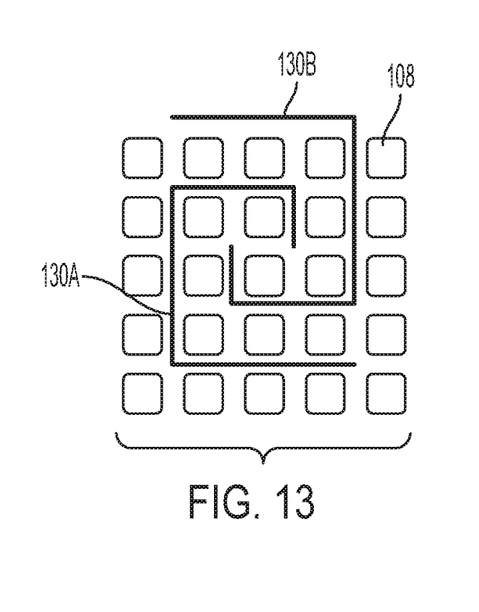
FIG. 13 shows a schematic top view of a system utilizing the lateral capacitance measurement approach of FIG. 12, in accordance with certain embodiments of the present disclosure.

FIGS. 12 and 13 show features and steps that also utilize capacitance measurements during a batch-transfer of electrical components. For this method, the transfer head 104 and/or the receiving substrate 106 would include a first serpentine-shaped conductive grid 130A and a second serpentine-shaped conductive grid 130B that function as a capacitance-based sensor (e.g., a lateral-capacitance sensor). In certain embodiments, the transfer head 104 and/or the receiving substrate 106 would be divided into different zones, each with its own first serpentine-shaped conductive grid 130A and second serpentine-shaped conductive grid 130B. Each zone could correspond to a position of one of the actuators 114.

As the transfer head 104 is moved towards the receiving substrate 106, each of the lateral-capacitance sensors will generate signals indicative of the measured capacitance. Signals from the capacitance sensors can be monitored to see how closely the measured capacitances match each other. Based on the signals, the system 100 can actuate one or more of the actuators 114 to adjust the shape of the transfer head 104 and/or the receiving substrate 106 until the capacitance of the various lateral-capacitance sensors closely matches each other. The actuators 114 can be actuated such that the actuators 114 move towards and contact the transfer head 104 and/or the receiving substrate 106 such that the actuators 114 cause the transfer head 104 and/or the receiving substrate 106 to deform. During the transfer process, the system 100 can monitor the signals from the lateral-capacitance sensors. Once the measured capacitances are acceptable, the actuators 114 can be locked into position and the electrical components 108 released from the transfer head 104.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
    a computing device including circuitry and memory with instructions for execution by the circuitry to:
       monitor signals indicative of a non-uniform distance between a transfer head and a receiving substrate, and
       in response to the monitored signals, actuate multiple actuators to extend a distance towards the transfer head or the receiving substrate to deform and shape the transfer head or the receiving substrate.

2. The system of claim 1, further comprising:
    a base assembly including the multiple actuators secured thereon.

3. The system of claim 2, wherein the multiple actuators are mechanical actuators.

4. The system of claim 2, wherein the multiple actuators are piezo-electric-based, voice-coil-motor-based, or magnetorestriction-based actuators.

5. The system of claim 2, further comprising:
    the receiving substrate, wherein the multiple actuators are arranged to be removably coupled to the receiving substrate to deform the receiving substrate.

6. The system of claim 1, wherein the monitored signals include signals indicative of light emitted from electrical components being transferred to the receiving substrate.

7. The system of claim 6, further comprising:
    an optical detector arranged to generate the monitored signals.

8. The system of claim 1, wherein the monitored signals include signals generated by capacitance sensors positioned on the transfer head and the receiving substrate.

9. The system of claim 1, wherein the transfer head includes a first set of conductive grids, wherein the receiving substrate includes a second set of conductive grids.

10. The system of claim 1, wherein either the transfer head or the receiving substrate includes a pair of serpentine-shaped conductive grids.

11. The system of claim 1, wherein the monitored signals include signals generated by electrical components being transferred to the receiving substrate.

12. The system of claim 11, further comprising:
    conductive pillars positioned between the transfer head and the receiving substrate and arranged to generate the monitored signals.

13. A method for transferring electrical components from a transfer head to a receiving substrate, the method comprising:
    monitoring signals indicative of a non-uniform distance between the transfer head and the receiving substrate; and
    shaping the transfer head or the receiving substrate by actuating multiple actuators to extend towards the transfer head or the receiving substrate to deform the transfer head or the receiving substrate based, at least in part, on the monitored signals.

14. The method of claim 13, wherein the monitored signals include signals indicative of light emitted from the electrical components being transferred to the receiving substrate.

15. The method of claim 14, wherein the multiple one or more actuators is actuated towards the transfer head or the receiving substrate until a minimum percentage or number of electrical components emit light.

16. The method of claim 13, wherein the monitored signals include signals generated by capacitance sensors positioned on the transfer head and/or the receiving substrate.

17. The method of claim 13, wherein the monitored signals include signals generated by the electrical components being transferred to the receiving substrate.

18. The method of claim 13, further comprising:
    deforming the transfer head or the receiving substrate, via the multiple actuators, until the transfer head or the receiving substrate are a substantially-uniform distance from each other.

19. The method of claim 13, further comprising:
deforming the transfer head or the receiving substrate, via the multiple actuators, until a minimum percentage or number electrical components are electrically coupled to bond pads positioned on the receiving substrate.

20. The method of claim 13, wherein the multiple actuators directly contact the transfer head or the receiving substrate to cause the shaping.

\* \* \* \* \*

UNITED STATES PATENT AND TRADEMARK OFFICE
CERTIFICATE OF CORRECTION

| | |
|---|---|
| PATENT NO. | : 11,246,251 B2 |
| APPLICATION NO. | : 16/402054 |
| DATED | : February 8, 2022 |
| INVENTOR(S) | : Michael J. Conover et al. |

It is certified that error appears in the above-identified patent and that said Letters Patent is hereby corrected as shown below:

In the Claims

Claim 15
Lines 1-2, "the multiple one or more actuators" should read -- the multiple actuators --.

Signed and Sealed this
Fifth Day of July, 2022

Katherine Kelly Vidal
*Director of the United States Patent and Trademark Office*